US012764912B2

(12) United States Patent
Li et al.

(10) Patent No.: US 12,764,912 B2
(45) Date of Patent: Oct. 13, 2026

(54) METHOD FOR CONTROLLING FAN BASED ON TEMPERATURE VARIATION TREND

(71) Applicants: INVENTEC (PUDONG) TECHNOLOGY CORPORATION, Shanghai (CN); INVENTEC CORPORATION, Taipei (TW)

(72) Inventors: Biao Li, Shanghai (CN); Yue Qian, Shanghai (CN); Lian-Fei Zhang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 428 days.

(21) Appl. No.: 18/220,274

(22) Filed: Jul. 11, 2023

(65) Prior Publication Data

US 2024/0407141 A1 Dec. 5, 2024

(30) Foreign Application Priority Data

Jun. 1, 2023 (CN) ......................... 202310646256.9

(51) Int. Cl.
*H05K 7/20* (2006.01)
*G05D 23/19* (2006.01)

(52) U.S. Cl.
CPC ..... *H05K 7/20836* (2013.01); *G05D 23/1917* (2013.01); *H05K 7/20736* (2013.01)

(58) Field of Classification Search
None
See application file for complete search history.

(56) References Cited

U.S. PATENT DOCUMENTS 5,718,373 A 2/1998 Kim et al.
7,098,617 B1 8/2006 Oljaca et al.
(Continued)

FOREIGN PATENT DOCUMENTS

GB 2434007 A * 7/2007 ............. G06F 1/206

OTHER PUBLICATIONS

Non-Final Office Action (U.S. Appl. No. 18/220,276) , dated Oct. 25, 2024, 15 pages.

(Continued)

*Primary Examiner* — Jennifer L Norton

(57) ABSTRACT

A method for controlling fan based on temperature variation trend is provided, controlling increase or decrease in fan rotation speed through controller, ensuring temperature of heating element. The method includes: reading current temperature value, temperature value of previous moment, and temperature value of moment immediately prior to the previous moment of the heating element; reading PWM value at previous moment of the fan; determining whether there is obvious temperature trend based on the current temperature value, the temperature value of previous moment, and the temperature value of moment immediately prior to the previous moment, when there is obvious temperature trend, calculating PWM difference value based on the current temperature value, otherwise, setting PWM difference value to be zero; calculating current PWM value based on PWM value at previous moment and PWM difference value; and controlling the rotation speed of the fan based on the current PWM value.

8 Claims, 5 Drawing Sheets

(56) References Cited

U.S. PATENT DOCUMENTS

| | | | | |
|---|---|---|---|---|
| 7,138,781 | B2 * | 11/2006 | Murray | G05B 13/024 318/609 |
| 8,489,250 | B2 * | 7/2013 | Aklilu | G05D 23/1917 361/679.48 |
| 9,192,076 | B2 * | 11/2015 | Artman | H05K 7/20209 |
| 9,578,787 | B2 * | 2/2017 | DeSouza | G06F 1/206 |
| 9,846,444 | B1 * | 12/2017 | Yang | G05D 23/1919 |
| 9,970,347 | B2 | 5/2018 | Hoff et al. | |
| 10,496,143 | B2 * | 12/2019 | Chen | G05D 23/1919 |
| 2002/0140389 | A1 * | 10/2002 | Ohki | G06F 1/206 318/471 |
| 2003/0137267 | A1 * | 7/2003 | Blake | F04D 27/004 318/471 |
| 2003/0216882 | A1 * | 11/2003 | Lai | G06F 1/20 702/132 |
| 2005/0081542 | A1 | 4/2005 | Braun et al. | |
| 2006/0108962 | A1 | 5/2006 | Murray et al. | |
| 2006/0181232 | A1 | 8/2006 | Oljaca et al. | |
| 2007/0047199 | A1 | 3/2007 | Tsutsui | |
| 2007/0076372 | A1 * | 4/2007 | Lin | H05K 7/20209 361/695 |
| 2008/0288124 | A1 * | 11/2008 | Huang | G06F 1/206 361/679.48 |
| 2010/0145548 | A1 * | 6/2010 | Ou | G05D 23/1913 318/471 |
| 2012/0330464 | A1 * | 12/2012 | Tsai | F04D 27/00 700/275 |
| 2014/0192475 | A1 * | 7/2014 | Tunks | G06F 1/206 165/244 |
| 2016/0115856 | A1 | 4/2016 | Ge et al. | |
| 2016/0291605 | A1 * | 10/2016 | Guo | F24F 11/76 |
| 2021/0337702 | A1 | 10/2021 | Yu | |
| 2024/0134430 | A1 * | 4/2024 | Gerhart | G05B 15/02 |
| 2024/0196573 | A1 * | 6/2024 | Chen | H05K 7/20209 |
| 2024/0402786 | A1 * | 12/2024 | Li | G06F 1/206 |
| 2025/0169025 | A1 * | 5/2025 | Wang | F04D 29/646 |
| 2026/0101484 | A1 * | 4/2026 | Xu | H05K 7/20836 |

OTHER PUBLICATIONS

Non-Final Office Action (U.S. Appl. No. 18/220,286) , dated Dec. 7, 2024, 15 pages.

Notice of Allowance (U.S. Appl. No. 18/220,285) , dated Sep. 30, 2024, 36 pages.

* cited by examiner

METHOD FOR CONTROLLING FAN BASED ON TEMPERATURE VARIATION TREND

This application claims priority under 35 U.S.C. §119 to Chinese Patent Application No. 202310646256.9, filed on Jun. 1, 2023, the entire content of which is incorporated herein in its entirety.

TECHNICAL FIELD

The present application relates to a method for controlling a fan based on temperature variation trend, and more particularly relates to a method for controlling a fan via a controller based on temperature variation of a heating element at three moments.

BACKGROUND

In general, in the existing technologies, in order to ensure that a temperature of an internal element of a server can meet its own specification requirements under various environmental temperatures and pressured loading conditions, three strategies for controlling temperature and fan are usually designed for the server: (1) an inlet speed control mode, (2) a PID speed control mode, and (3) an abnormal speed control mode. A logic for selecting these three strategies for controlling fan is shown in the flow chart FIG. 1.

A test is started (Step S001), and it is checked whether an element exists and whether a temperature reading is normal (Step S002). Here, the element usually refers to a heating element that generates heat, such as a central processing unit (CPU) or a graphics processing unit (GPU). If the element does not exist or the temperature reading is abnormal (Step S003), then the abnormal speed control mode is selected (Step S004).

When the Step S002 determines that the element exists and the temperature reading is normal, a Tsp value, a PID value, and a pulse-width modulation value PMW(inlet) of a fan environment are read (Step S005). Here, the so-called SP refers to an abbreviation of a setpoint, the Tsp is a critical temperature for safe operation of the element, the PID value is three parameters used in PID control (explained later), and the pulse-width modulation value is abbreviated as PWM. Next, a current temperature T(i) of the element and a current PWM value PWM(i) of the fan are read (Step S006). Then, T(i) is compared with Tsp and PWM(i) is compared with PWM(inlet) (Step S007). When T(i)<Tsp and PWM(i)=PWM(inlet), the inlet speed control mode is selected (Step S008). The so-called inlet speed control refers to a strategy for controlling the rotation speed of the fan based on an environmental temperature.

When T(i)>Tsp or when T(i)<Tsp and PWM(i)>PWM(inlet), the PID speed control mode is selected (Step S009). The so-called PID speed control, which stands for "proportional, integral, derivative control", has PID control values that include a proportional coefficient Kp, an integral coefficient Ki, and a derivative coefficient Kd. This is a commonly used strategy for controlling fan, which is usually activated during a pressured loading test, and its objective is to quickly adjust an appropriate rotation speed of the fan to meet a temperature control requirement of the element. The flow chart for a commonly used PID control strategy is shown in FIG. 2.

In the PID speed control mode at the moment, a current temperature T(i) of the element and a current PWM value PWM(i) of the fan are first read (Step S0091). Then, T(i) is compared with Tsp and PWM(i) is compared with PWM (inlet) (Step S0092). When T(i)>Tsp, a PWM difference ΔPWM(i) is calculated, which is to be greater than 0 (Step S0093); furthermore, PWM(i)=PWM(i−1)+ΔPWM(i), a rotation speed of the fan is increased (Step S0094). Here, PWM(i−1) is the PWM value of the fan at a previous moment.

When T(i)<Tsp and PWM(i)>PWM(inlet), the PWM difference ΔPWM(i) is calculated to be less than 0 (Step S0095), and since PWM(i)=PWM(i−1)+ΔPWM(i), the rotation speed of the fan is decreased. (Step S0096).

A calculation method for the PWM difference ΔPWM(i) is as follows: PWM(i)=Kp*[e(i)−e(i−1)]+Ki*e(i)+Kd*[T(i)−2*T(i−1)+T(i−2)], where e(i)=T(i)−Tsp, T(i) is a temperature of the element at moment i, i.e., a temperature at the current moment, and Tsp is the critical temperature for safe operation of the element. Kp, Ki, and Kd are the proportional coefficient, the integral coefficient, and the derivative coefficients respectively.

Finally, regardless whether the abnormal speed control mode (Step S004), the inlet speed control mode (Step S008), or the PID speed control mode (Step S009) is selected, the current PWM value PWM(i) of the fan needs to be output (Step S010).

Because the above-mentioned PID speed control strategy is based on temperature, the pulse width modulation value of the fan changes directly with the temperature of the element. Although the PID speed control strategy has a fast response speed, it still faces certain problems in a practical application. In addition to a temperature fluctuation that may exist in the element itself, an internal air distribution of the server may also cause the temperature of the element to constantly change, resulting in an unstable rotation speed of the fan; further, the changing rotation speed of the fan reacts on the element, causing fluctuation in the temperature of the element.

During an actual element testing process, the above-mentioned heating element may determine the rotation speed of the fan. During a period of time when there is neither change in the environmental temperature nor change in the pressured loading condition, the temperature of the heating element may constantly change within a range, and the rotation speed of the fan may also fluctuate up and down within a range. A continuous fluctuation in the rotation speed of the fan not only increases a power consumption of the fan, leading to an increased power consumption of the entire system, but also reflects insufficient control on the fan. Therefore, solving a problem of fluctuation in the rotation speed of the fan is extremely important and necessary.

SUMMARY

In view of the above, a rotation speed fluctuation and power loss generation problem caused by controlling rotation speed of the fan is an urgent issue needs to be resolved.

To resolve the problem, an essential technical measure adopted by the present disclosure is to provide a method for controlling fan based on temperature variation trend, which controls increase or decrease in rotation speed of the fan through a controller, such that temperature of a heating element may be ensured. The method includes: reading a current temperature value T(i), a temperature value T(i−1) of a previous moment, and a temperature value T(i−2) of a moment immediately prior to the previous moment of the heating element; reading a pulse width modulation value PWM(i−1) at the previous moment of the fan; determining whether there is an obvious temperature trend based on the current temperature value T(i), the temperature value T(i−1)

of the previous moment, and the temperature value T(i−2) of the moment immediately prior to the previous moment, (a) when there is an obvious temperature trend, calculating a pulse width modulation difference value ΔPWM(i) based on the current temperature value T(i), (b) when there is no obvious temperature trend, setting the pulse width modulation difference value ΔPWM(i) to be zero; calculating a current pulse width modulation value PWM(i) based on the pulse width modulation value PWM(i−1) at the previous moment and the pulse width modulation difference value ΔPWM(i); and controlling the rotation speed of the fan based on the current pulse width modulation value PWM(i).

According to an auxiliary technical measure derived from the essential technical measure, prior to determining whether there is an obvious temperature trend, further, it further includes: determining whether there is a temperature trend based on the current temperature value T(i) and the temperature value T(i−1) of a previous moment, (1) when there is a temperature trend, calculating the pulse width modulation difference value ΔPWM(i) based on the current temperature value T(i); (2) when there is no obvious temperature trend, further comparing the current temperature value T(i), the temperature value T(i−1) at the previous moment and the temperature value T(i−2) at the moment immediately prior to the previous moment to determine whether there is an obvious temperature trend.

According to an auxiliary technical measure derived from the essential technical measure, the heating element has a critical temperature value Tsp, the controller has PID values which are a proportional coefficient Kp, an integral coefficient Ki, and a differential coefficient Kd respectively; in case of determining that there is an obvious temperature trend, calculating the pulse width modulation difference value ΔPWM(i) according to the following formula:

$$\Delta PWM(i) = Kp*[e(i)-e(i-1)]+Ki*e(i)+Kd*[T(i)-2*T(i-1)+T(i-2)],$$

$$\text{where } e(i)=T(i)-Tsp.$$

In view of the above, since the method for controlling fan based on temperature variation trend of the present disclosure is a method for controlling fan using a PID controller that is based on temperature variation across three moments of a heating element, the present disclosure is able to effectively enhance speed control stability of the fan, and avoid power consumption waste caused by long-term fluctuation in the fan.

Specific embodiments adopted by the present disclosure are further illustrated in accordance with the following embodiments and accompanying drawings.

Figure 1:
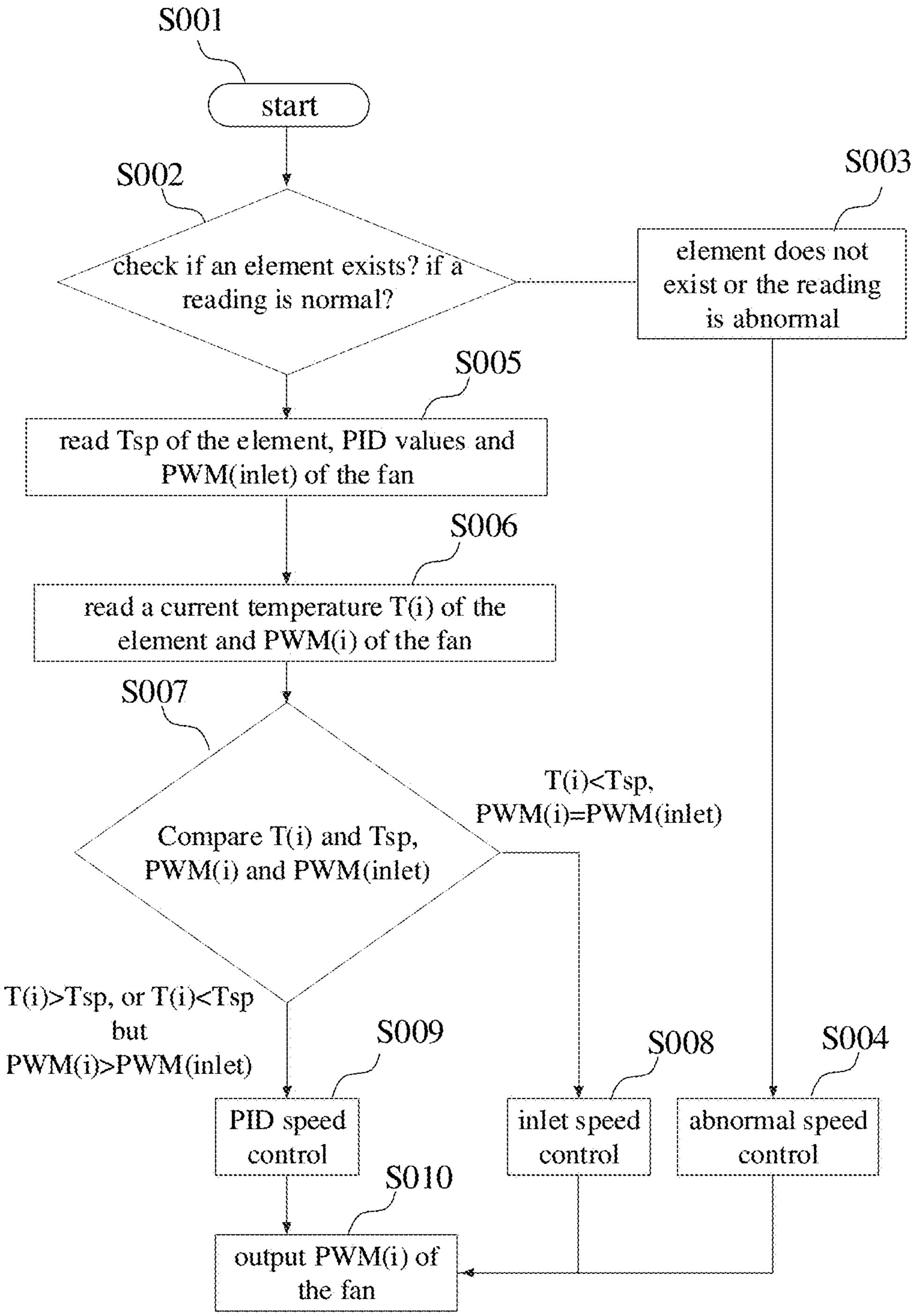
FIG. 1 (PRIOR ART)
FIG. 1 shows a flow chart of a commonly used way for selecting three types of fan speed control strategies.

descriptions of reference numerals are as follows:

10, 10': element;
20, 20': baseboard management controller;
21, 21': input unit;
22, 22': storage unit;
23, 23': calculation unit;
24, 24': output unit;
30, 30': complex programmable logic device;
40, 40': fan;
50: expander;
S001~S010: step;
S0091~S0096: step;
S1091~S1096: step.

DETAILED DESCRIPTION OF THE EMBODIMENTS

Figure 3:
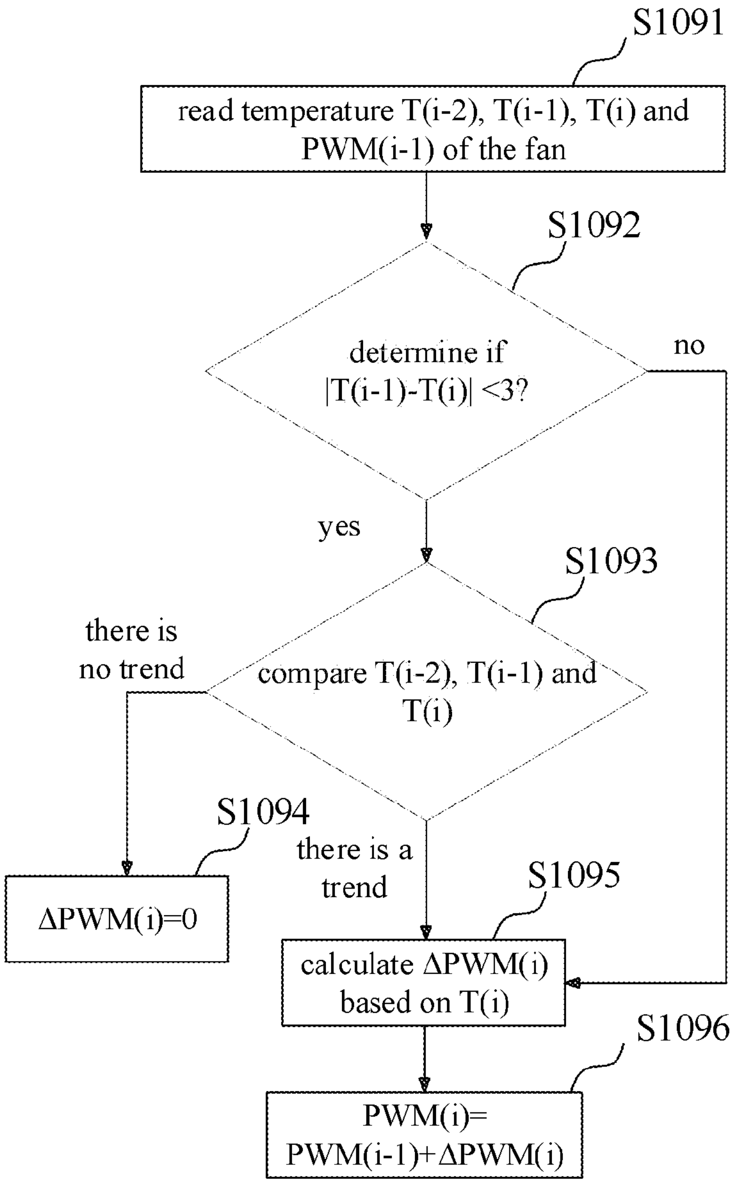
FIG. 3 shows a flow chart of a method for controlling fan based on temperature variation trend provided by a preferred embodiment of the present disclosure.
Figure 4:
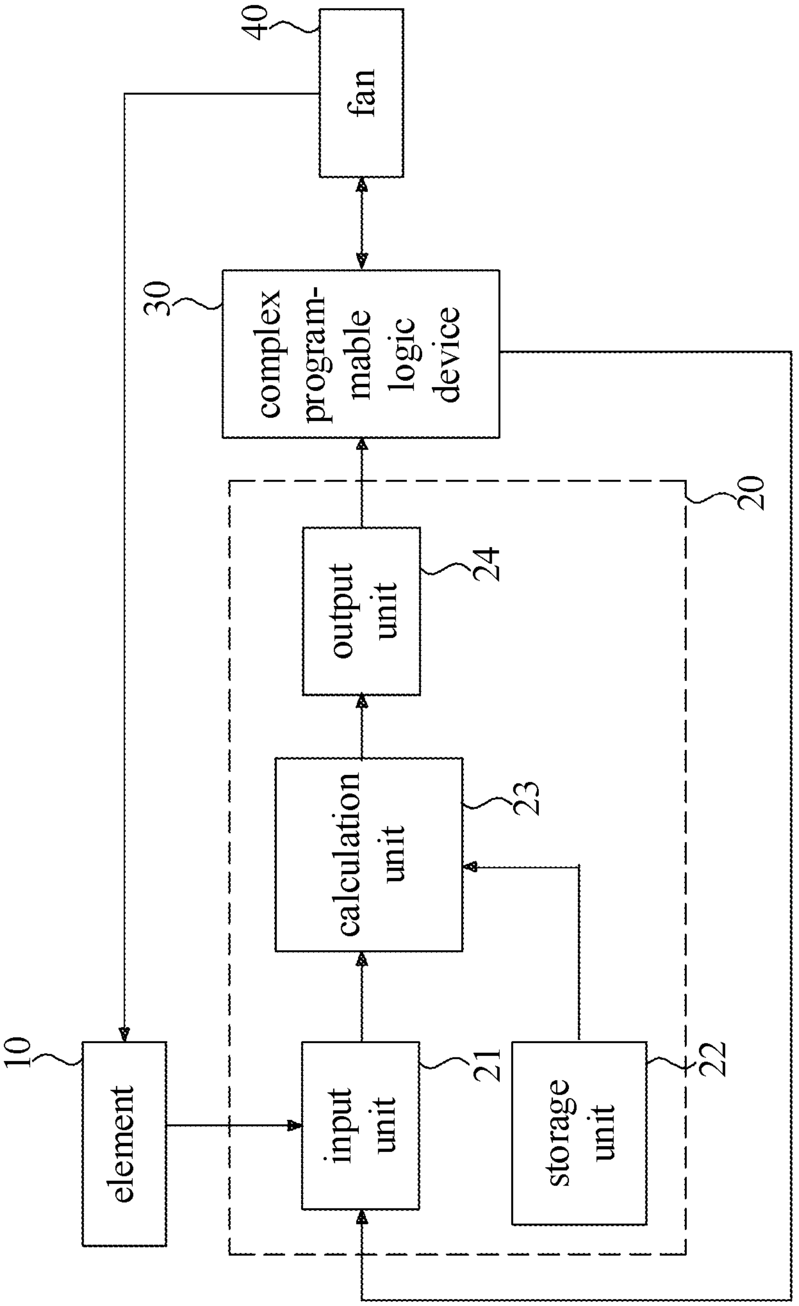
FIG. 4 shows a schematic diagram of a first structure for implementing a method for controlling fan based on temperature variation trend provided by a preferred embodiment of the present disclosure.
Figure 5:
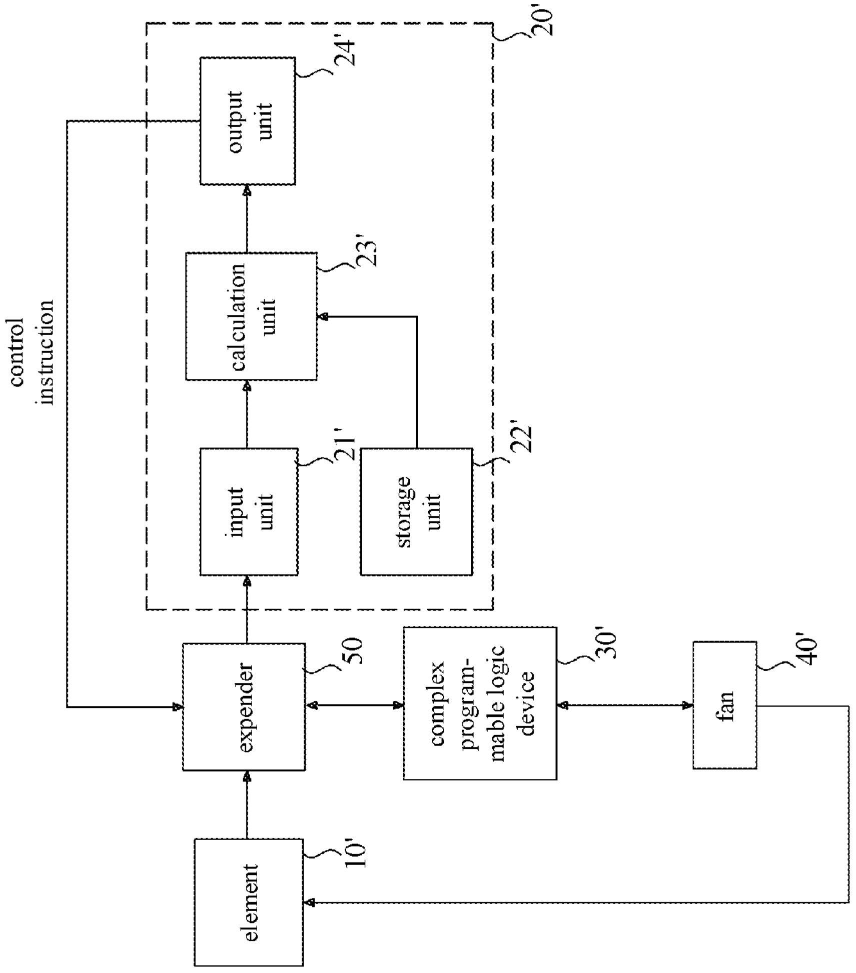
FIG. 5 shows a schematic diagram of a second structure for implementing a method for controlling fan based on temperature variation trend provided by a preferred embodiment of the present disclosure.

Reference may be made to FIG. 3, which shows a flow chart of a method for controlling fan based on temperature variation trend provided by a preferred embodiment of the present disclosure. FIG. 4 and FIG. 5 show a schematic diagram of a first structure and a schematic diagram of a second structure, for implementing a method for controlling fan based on temperature variation trend provided by preferred embodiments of the present disclosure, references to these figures may also be made to.

As shown in FIG.3, the present application discloses a method for controlling fan 40 or fan 40' based on temperature variation trend, that is, to control increase or decrease in rotation speed of fan 40 or rotation speed of fan 40' through a controller, such that temperature of a heating element can be ensured. The controller may be, for example, baseboard management controller (BMC) 20 or baseboard management controller (BMC) 20', which contains a Proportion Integration Differentiation (PID) controller, or a PID control value is stored in storage unit 22 or storage unit 22' of the BMC 20/20' for calculation by calculation unit 23 or calculation unit 23'. The heating element may be, for example, element 10 or element 10' shown in the figures, which is generally referred to as a heating element that can generate heat, such as a central processing unit (CPU) or a graphics processing unit (GPU).

The method of the present disclosure includes: reading a temperature value T(i) at a current moment, a temperature value T(i−1) at a previous moment, and a temperature value T(i−2) at a moment immediately prior to the previous moment of an element 10 or an element 10', and reading a pulse width modulation value PWM(i−1) at the previous moment of the fan 40 or the fan 40' (Step S1091).

Next, the present disclosure determines whether there is a temperature trend by comparing the temperature value T(i) at the current moment with the temperature value T(i−1) at the previous moment. The step of determining whether there is a temperature trend is to calculate an absolute value of a difference between the temperature value T(i) at the current moment and the temperature value T(i−1) at the previous moment, that is, whether the following condition is satisfied: $|T(i)-T(i-1)|<3$ (Step S1092). When the absolute value of the difference is not less than 3, that is, when $|T(i)-T(i-1)|\geq 3$, it is determined that there is a temperature trend. When there is a temperature trend, a pulse width modulation difference ΔPWM(i) of the fan 40 or the fan 40' is calculated based on the temperature value T(i) at an i-th moment, that is the temperature value at the current moment (Step S1095). When the absolute value of the difference is less than 3, it is determined that there is no temperature trend. At this time, the temperature value T(i) at the current moment, the temperature value T(i−1) at the previous moment, and the temperature value T(i−2) at the moment immediately prior to the previous moment are further compared to determine whether there is a significant temperature trend (Step S1093).

A way of calculation and an influencing factor related to a temperature difference being 3 degrees are as follows: when determining whether $|T(i)-T(i-1)|<3$, it is to determine whether the temperature difference between the temperature value T(i) at the i-th moment and the temperature value T(i−1) at an (i−1)-th moment is within 3 degrees. Due to a possibility of a pulsating pressured loading manner during an actual test, power consumption of the element 10 or the element 10' may drop from full power to half power and then rise to full power within a period of time, causing significant changes in power consumption and temperature of the element 10 or the element 10' in a short period of time. At this time, the fan 40 and the fan 40' need to respond quickly to these drastic changes, however, determination of the temperature trend requires time. Therefore, setting there is a temperature trend in case that the temperature difference is greater than or equal to 3 degrees, the pulse width modulation difference ΔPWM(i) may be directly calculated based on the current temperature value T(i) at the i-th moment. This not only prevents the fan 40 and the fan 40'from being interfered by an occasional temperature fluctuation of the element 10 or the element 10', allowing the rotation speed of fan 40/40' to be more stable, but also makes quick respond to temperature control needs of the element 10/10' for a sudden change in temperature, thereby avoiding the element 10 or the element 10' from overheating, and ensuring safety of the element 10/10'.

In addition, since the present disclosure has improved PID speed control, in order to enable the rotation speed of fan 40 or fan 40' to quickly respond to a heat dissipation requirement of the element 10 or 10', while considering a potential abnormal risk, the following requirements and improvements are proposed to calculation of a PID speed control of the baseboard management controller 20/20': the temperature value T(i) at the current moment, the temperature value T(i−1) at the previous moment, and the temperature value T(i−2) at the moment immediately prior to the previous moment of the element 10/10' being read by the baseboard management controller 20/20' are all floating-point data with decimal places, and this data is used in PID speed control calculation of the baseboard management controller 20/20'.

Improvements and advantages due to floating-point data are as follows. Data type currently saved and used for PID speed control calculation by the baseboard management controller 20/20' is an integer type. For example, temperature values of the element 10 and the element 10' being read are 23.4 and 22.6 respectively. This data may be adjusted to an integer by rounding up, rounding down, or rounding off, that is, temperature values being output and used for calculation by the baseboard management controller 20 and the baseboard management controller 20' are all adjusted integer values. This results in a certain gap between the pulse width modulation difference value ΔPWM(i) being calculated by the PID speed control and an actual required pulse width modulation difference value ΔPWM(i), which causes the fan 40/40' to be under-regulated or over-regulated. Therefore, the present disclosure uses floating-point data, and the temperature value being involved in the PID speed control calculation is data with a decimal point, and the pulse width modulation difference value ΔPWM(i) being calculated is an actual value required by the element 10/10'. This is conducive to fast and accurate response of fan 40/40'.

Furthermore, it is necessary to identify and determine the temperature trend. As mentioned earlier, by comparing the temperature value T(i) at the current moment, the temperature value T(i−1) at the previous moment, and the temperature value T(i−2) at the moment immediately prior to the previous moment, it may be determined whether there is a clear temperature trend (Step S1093). First, it should be clarified that regardless of ambient temperature, usually under a non-pressured loading condition or a pressured loading condition with stable power, temperature variations of elements inside the server are continuous and regular within a short period of time. The temperatures thereof remain unchanged, increase gradually or decrease gradually, and fluctuation in a sine-like form or other irregular forms may not exist. Based on this understanding, identification and determination of the temperature trend may be explained as follows.

The temperature value read from the element 10 or the element 10' at the i-th moment is T(i). In order to obtain a basis of temperature variation of the element 10 or the element 10', the present disclosure also introduces process of reading the temperature value T(i−2) at the i−2th moment and the temperature value T(i−1) at the i−1th moment. The following may be multiple cases regarding a relationship among the temperature values T(i−2), T(i−1), and T(i).

1. When $T(i-2)=T(i-1)$, three cases are presented as follows: (i) when $T(i)=T(i-1)$, the temperature values of the three moments are equal, showing no variation trend; (ii) when $T(i)>T(i-1)$, this shows an initial growth trend, but the temperature variation trend still needs to be determined based on comparison with the temperature value of a next moment; (iii) when $T(i)<T(i-1)$, this shows an initial downward trend, but the temperature variation trend still needs to be determined based on comparison with the temperature value of a next moment.
2. When $T(i-2)<T(i-1)$, four cases are presented as follows: (i) when $T(i)=T(i-1)$, this shows an obvious temperature increase trend; (ii) when $T(i)>T(i-1)$, this shows an obvious temperature increase trend; (iii) when $T(i)=T(i-2)<T(i-1)$, this shows no obvious temperature increase trend; (iv) when $T(i)<T(i-2)<T(i-1)$, this shows no obvious temperature increase trend.
3. When $T(i-2)>T(i-1)$, four cases are presented as follows: (i) when $T(i)=T(i-1)$, this shows an obvious temperature decrease trend; (ii) when $T(i)<T(i-1)$, this shows an obvious temperature decrease trend; (iii) when $T(i)=T(i-2)>T(i-1)$, this shows no obvious temperature variation trend; (iv) when $T(i)>T(i-2)>T(i-1)$, this shows no obvious temperature variation trend.

The above-mentioned description presents a total of 11 possible temperature value relationships, but only the following 4 cases show an obvious temperature variation trend: $T(i-2)<T(i-1)$ and $T(i)=T(i-1)$, $T(i-2)<T(i-1)$ and $T(i)>T(i-1)$, $T(i-2)>T(i-1)$ and $T(i)=T(i-1)$, and $T(i-2)>T(i-1)$ and $T(i)<T(i-1)$. The other 7 cases are unable to show an obvious temperature variation trend.

Therefore, when it is determined that there is an obvious temperature trend, i.e., there is a trend, a pulse width modulation difference value ΔPWM(i) is calculated using the current temperature value T(i) (Step S1095).

When it is determined that there is no obvious temperature trend, i.e., there is no trend, a pulse width modulation value PWM(i−1) at a previous moment, that is, a pulse width modulation value at the (i−1)-th moment is maintained, i.e., the pulse width modulation difference value ΔPWM(i) is set to be zero (Step S1094).

Furthermore, based on the pulse width modulation value PWM(i−1) at a previous moment and the pulse width modulation difference value ΔPWM(i), a current pulse width modulation value PWM(i) is obtained, which is calculated according to the following formula: PWM(i)=PWM(i−1)+ΔPWM(i) (Step S1096). Finally, the rotation speed of fan 40 or fan 40' is controlled based on the calculated current pulse width modulation value PWM(i).

In the present disclosure, when it is determined that there is an obvious temperature trend, a specific way of calculation for the pulse width modulation difference value ΔPWM (i) of the fan 40 or the fan 40' may be referred to the above-mentioned description, that is, it may be calculated according to the following formula: ΔPWM(i)=Kp*[e(i)−e(i−1)]+Kie(i)+Kd[T(i)−2*T(i−1)+T(i−2)]. Here, e(i)=T(i)+Tsp, where T(i) is a temperature of the element 10 or the element 10' at an i-th moment, which is a temperature at a current moment; Tsp is a critical temperature for safe operation of the element 10 or the element 10'; and Kp, Ki, and Kd are PID control values stored in the baseboard management controller 20 or the baseboard management controller 20', which are a proportional coefficient, an integral coefficient, and a differential coefficient respectively.

In addition, it should be especially noted that according to the present disclosure, the pulse width modulation difference value ΔPWM(i) obtained through PID speed control calculation is rounded down to an integer value, in order to satisfy thermal requirements of the element 10/10' at a lowest fan power consumption.

Figure 2:
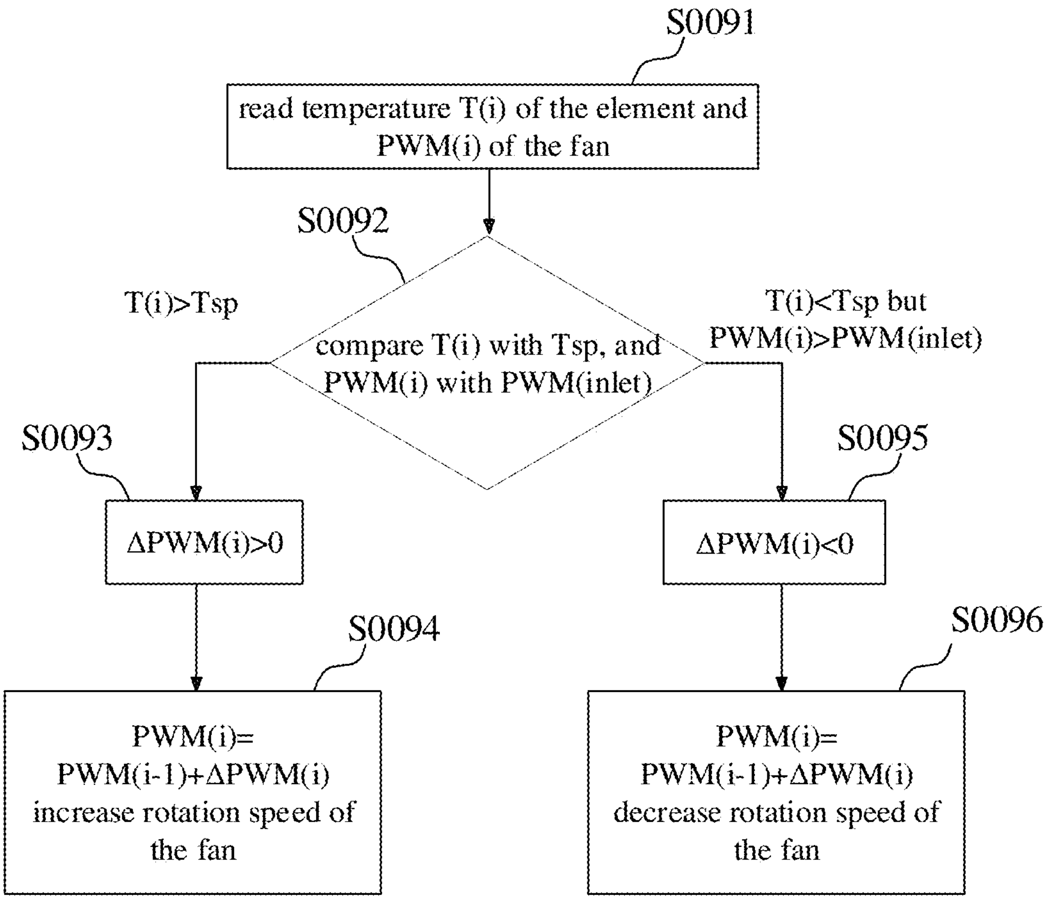
FIG. 2 (PRIOR ART)
FIG. 2 shows a flow chart of a commonly used PID control strategy.

Therefore, the PID speed control strategy based on temperature variation trend of the present disclosure is described above. It should be particularly noted that the speed control method disclosed by the present disclosure is used to replace the PID speed control strategy shown in FIG. 2. The present disclosure may replace the PID speed control (Step S009) portion and combine with the rest of the three strategies for controlling rotation speed of the fan shown in FIG. 1, thereby achieving a complete method for selecting the three strategies for controlling rotation speed of the fan.

Reference may be made to FIG. 4, which shows a schematic diagram of a first structure for implementing a method for controlling fan 40 based on temperature variation trend according to a preferred embodiment of the present disclosure. The above-mentioned PID speed control strategy in the present disclosure is programmed into the baseboard management controller 20, and a specific control logic is as follows. The baseboard management controller 20 communicates with element 10 and a complex programmable logic device 30 (CPLD in abbreviation). An input unit 21 of the baseboard management controller 20 reads a temperature of element 10, a rotation speed of fan 40, and other information. A heat dissipation strategy (including a PID speed control strategy) stored in a storage unit 22 of the baseboard management controller 20 along with the above-mentioned information read by the input unit 21 are transmitted to a calculation unit 23 of the baseboard management controller 20. The calculation unit 23 determines whether the overall system platform is in a normal working state to decide whether to launch a PID speed control and a way of calculation in case of launching the PID speed control, and so forth. A calculated PWM difference value ΔPWM(i) of fan 40 is further transmitted as a fan control instruction to CPLD 30 by an output unit 24 of the baseboard management controller 20. The CPLD 30 further transmits the fan control instruction, which is transmitted by the baseboard management controller 20, to the fan 40. The fan 40 may determine whether and how to adjust its speed according to the fan control instruction sent by the CPLD 30, eventually completing a control of the fan 40 by the baseboard management controller 20. Additionally, the fan 40 transmits a fan signal, which includes information such as rotation speed, to the CPLD 30, and the CPLD 30 transmits its feedback to the input unit 21. Therefore, change in the rotation speed of fan 40 may cause a change in the temperature of element 10, which further counter reacts on the control by the baseboard management controller 20, achieving a bidirectional interaction between the temperature of element 10 and the rotation speed of fan 40.

Furthermore, reference may be made to FIG. 5, which is a schematic diagram of a second structure for implementing a method for controlling a fan 40' based on temperature variation trend according to a preferred embodiment of the present disclosure. In this case, the element 10' is indirectly controlled by a baseboard management controller 20', and a control method for the fan 40' is as follows. Under such condition, communication between the baseboard management controller 20' and a complex programmable logic device 30' may be accomplished via an additional coordinating element, for example, via an expander 50 to indirectly communicate with the complex programmable logic device 30'. Temperature information of the element 10' is transmitted to the expander 50. A fan signal of the fan 40', which includes information such as rotation speed, is first transmitted to the complex programmable logic device 30', then to the expander 50, and the expander 50 eventually transmit the temperature information and the fan signal to the baseboard management controller 20'. An output unit 24' of the baseboard management controller 20' transmits a pulse width modulation difference value ΔPWM (i) of the fan 40' obtained by a calculation unit 23' of the baseboard management controller 20' as a fan control instruction to the expander 50, and the fan control instruction is first transmitted to the complex programmable logic device 30', and then transmitted to the fan 40'. The fan 40' may determine whether and how to adjust its rotation speed according to the fan control instruction transmitted by the complex programmable logic device 30', eventually completing a control of the fan 40' by the baseboard management controller 20'. As to remaining parts, reference may be made to the above-mentioned description for FIG. 4.

In view of a poor anti-interference ability problem and an unstable speed control problem of the fan 40/40' caused by existing PID control strategy that directly uses temperature as a basis for determination, the present disclosure proposes a PID control strategy that uses temperature variation trend as a basis for determination, which has the following advantages.

1. The rotation speed of fan 40 or fan 40' is controlled based on a current element temperature, such that response speed is fast and control accuracy is high.
2. Temperature noise is automatically eliminated, such that a drastic fluctuation in the rotation speed of fan 40/40' caused by an occasional temperature fluctuation may be avoided, which further avoids an unstable state of the fan in a long-term because of this issue, thereby achieving stable speed control.
3. Speed control stability of fan 40/40' is enhanced, which prolongs service life of fan 40/40'.

4. By a way of reducing fluctuation in the rotation speed of fan 40/40' and prolonging service life of fan 40/40', operation and maintenance costs of the system are reduced.

In view of the above, compared with existing PID control strategy that directly uses temperature as a basis of determination, the PID control strategy based on temperature variation trend proposed by the present disclosure can not only respond to temperature control needs of the element 10/10' quickly, but also has an outstanding strong anti-interference ability, which can automatically eliminate occasional data noise, improve speed control stability of the fan 40/40', avoid power consumption waste caused by long-term fluctuation in the fan 40/40', and further prolong service life of the fan 40/40', thereby greatly reducing operation and maintenance costs of the system.

The above-mentioned preferred embodiments are illustrated in the hope that features and spirits of the present disclosure are described more clearly, yet the scope of the present disclosure shall not be limited by using the above-mentioned preferred embodiments being disclosed. On the contrary, the objective is to cover various alternations and equivalent arrangements within the intended scope of the present disclosure.

What is claimed is:

1. A method for controlling a fan based on a temperature variation trend, wherein the method for controlling the fan comprises:

reading a current temperature value T(i), a temperature value T(i−1) of a previous moment, and a temperature value T(i−2) of a moment immediately prior to the previous moment of a heating element;

reading a pulse-width modulation (PWM) value PWM(i−1) of the fan at the previous moment;

determining whether an obvious temperature trend based on the current temperature value T(i), the temperature value T(i−1) of the previous moment, and the temperature value T(i−2) of the moment immediately prior to the previous moment; (a) in a case where the obvious temperature trend exists, calculating a PWM difference value ΔPWM(i) according to a formula:

$$\Delta PWM(i) = Kp * [e(i) - e(i-1)] + Ki * e(i) + Kd * [T(i) - 2 * T(i-1) + T(i-2)],$$

$$\text{where } e(i) = T(i) - Tsp.$$

Tsp is a critical temperature value of the heating element, and a proportional coefficient Kp, an integral coefficient Ki, and a differential coefficient Kd are PID values of a controller respectively; (b) in a case where the obvious temperature trend does not exist, setting the PWM difference value ΔPWM(i) to zero;

calculating a current PWM value PWM(i) based on the PWM value PWM(i−1) at the previous moment and the PWM difference value ΔPWM(i); and controlling an increase or decrease of a rotation speed of the fan using the controller based on the current PWM value PWM(i).

2. The method of claim 1, wherein prior to the determining of whether the obvious temperature trend exists, the method further comprises:

determining whether a temperature trend exists between the current temperature value T(i) and the temperature value T(i−1) of the previous moment, in a case where the temperature trend does not exist, further comparing the current temperature value T(i), the temperature value T(i−1) at the previous moment and the temperature value T(i−2) at the moment immediately prior to the previous moment to determine whether the obvious temperature trend exists.

3. The method of claim 2, wherein the determining of whether the temperature trend exists comprises:

calculating an absolute value of a difference between the current temperature value T(i) and the temperature value T(i−1) of the previous moment, in a case where the absolute value of the difference is smaller than 3, determining that the temperature trend does not exist.

4. The method of claim 1, wherein in a case where the temperature value T(i−2) at the moment immediately prior to the previous moment is smaller than the temperature value T(i−1) at the previous moment and the current temperature value T(i) is greater than or equal to the temperature value T(i−1) at the previous moment, the obvious temperature trend exists.

5. The method of claim 1, wherein in a case where the temperature value T(i−2) at the moment immediately prior to the previous moment is greater than the temperature value T(i−1) at the previous moment and the current temperature value T(i) is smaller than or equal to the temperature value T(i−1) at the previous moment, the obvious temperature trend exists.

6. The method of claim 1, wherein the current PWM value PWM(i) is calculated according to a formula: PWM(i) =PWM(i−1)+ΔPWM(i).

7. The method of claim 1, wherein the calculated PWM difference value ΔPWM(i) is rounded down to an integer value.

8. The method of claim 1, wherein the current temperature value T(i), the temperature value T(i−1) of the previous moment, and the temperature value T(i−2) of the moment prior to the previous moment of the heating element are all floating-point data with decimal places.

* * * * *